United States Patent
Uchida et al.

(10) Patent No.: US 10,038,016 B2
(45) Date of Patent: Jul. 31, 2018

(54) DISPLAY DEVICE

(71) Applicant: Japan Display Inc., Minato-ku (JP)

(72) Inventors: Makoto Uchida, Tokyo (JP); Takanori Tsunashima, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/631,321

(22) Filed: Jun. 23, 2017

(65) Prior Publication Data

US 2017/0373096 A1   Dec. 28, 2017

(30) Foreign Application Priority Data

Jun. 24, 2016   (JP) .................. 2016-125604

(51) Int. Cl.
*H01L 27/12*   (2006.01)
(52) U.S. Cl.
CPC ........ *H01L 27/1255* (2013.01); *H01L 27/124* (2013.01)
(58) Field of Classification Search
CPC .......................... H01L 27/124; H01L 27/1225
USPC .............................................. 257/71; 345/76
See application file for complete search history.

(56) References Cited

U.S. PATENT DOCUMENTS

| | | | | |
|---|---|---|---|---|
| 2008/0186259 A1* | 8/2008 | Todorokihara | .......... | G02F 1/167 345/76 |
| 2014/0151652 A1* | 6/2014 | Im | ................. | H01L 51/5228 257/40 |
| 2015/0103284 A1* | 4/2015 | Nagasawa | ......... | G02F 1/134336 349/46 |

FOREIGN PATENT DOCUMENTS

JP   2010-3910   1/2010

* cited by examiner

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

According to one embodiment, a display device includes a pixel, a scanning line, a signal line, a pixel electrode, a first switching element, and a capacitance line producing capacitance together with the pixel electrode. The first switching element includes a first semiconductor layer connected to the signal line and the pixel electrode, and a first gate electrode opposed to the first semiconductor layer and connected to the scanning line. The capacitance line includes a first portion opposed to the scanning line and extending in an extension direction of the scanning line, a second portion connected to the first portion and opposed to the pixel electrode.

10 Claims, 6 Drawing Sheets

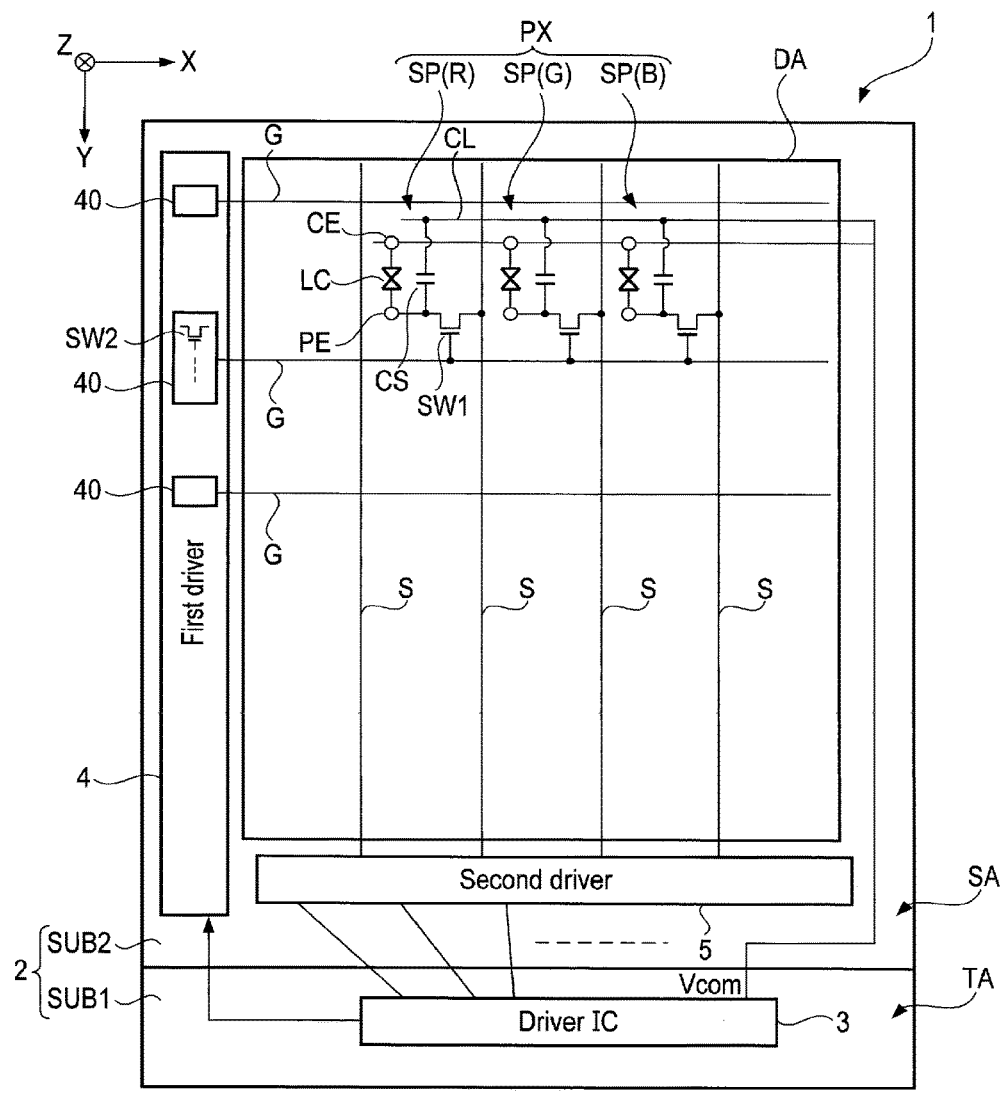
F I G. 1

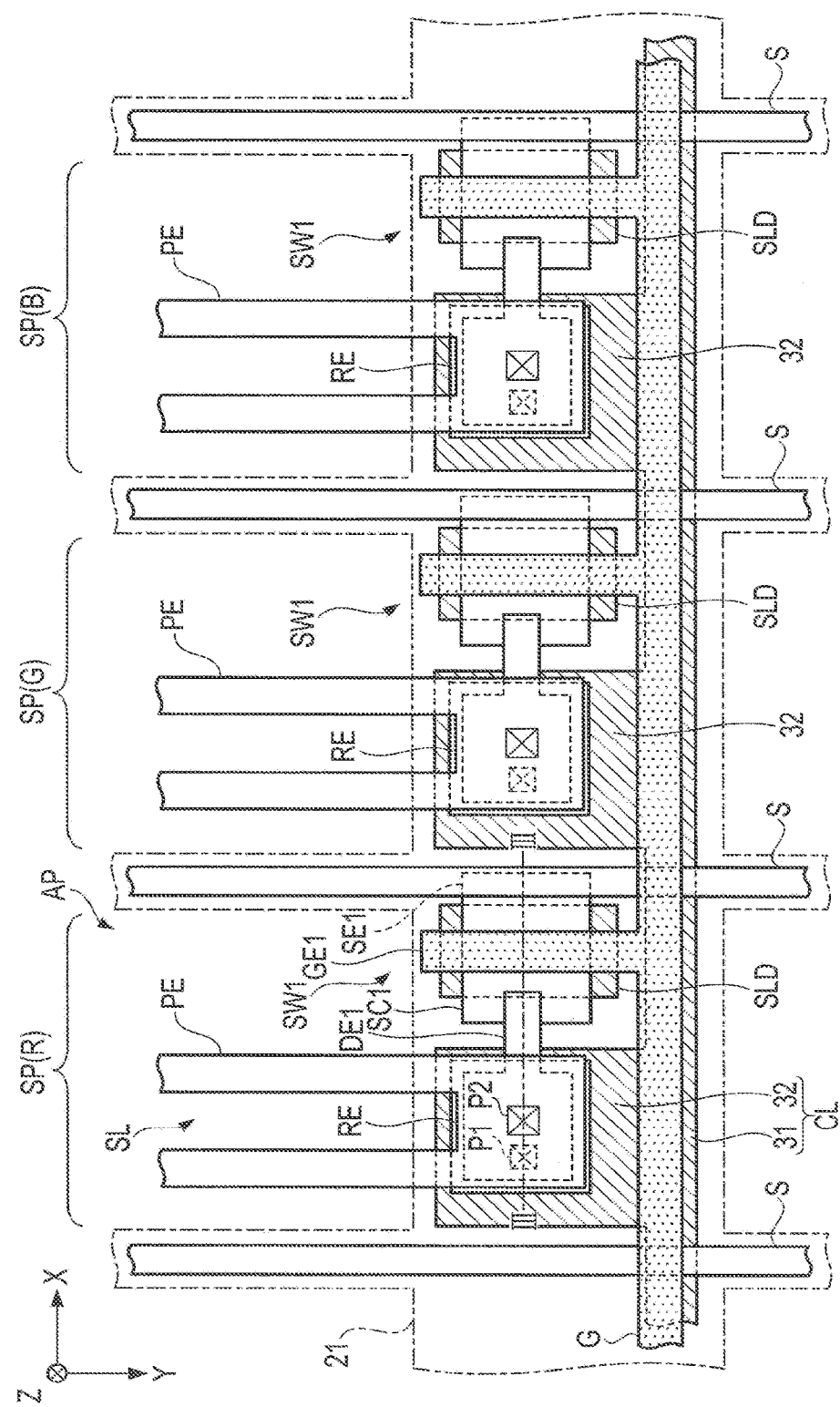
F I G. 2

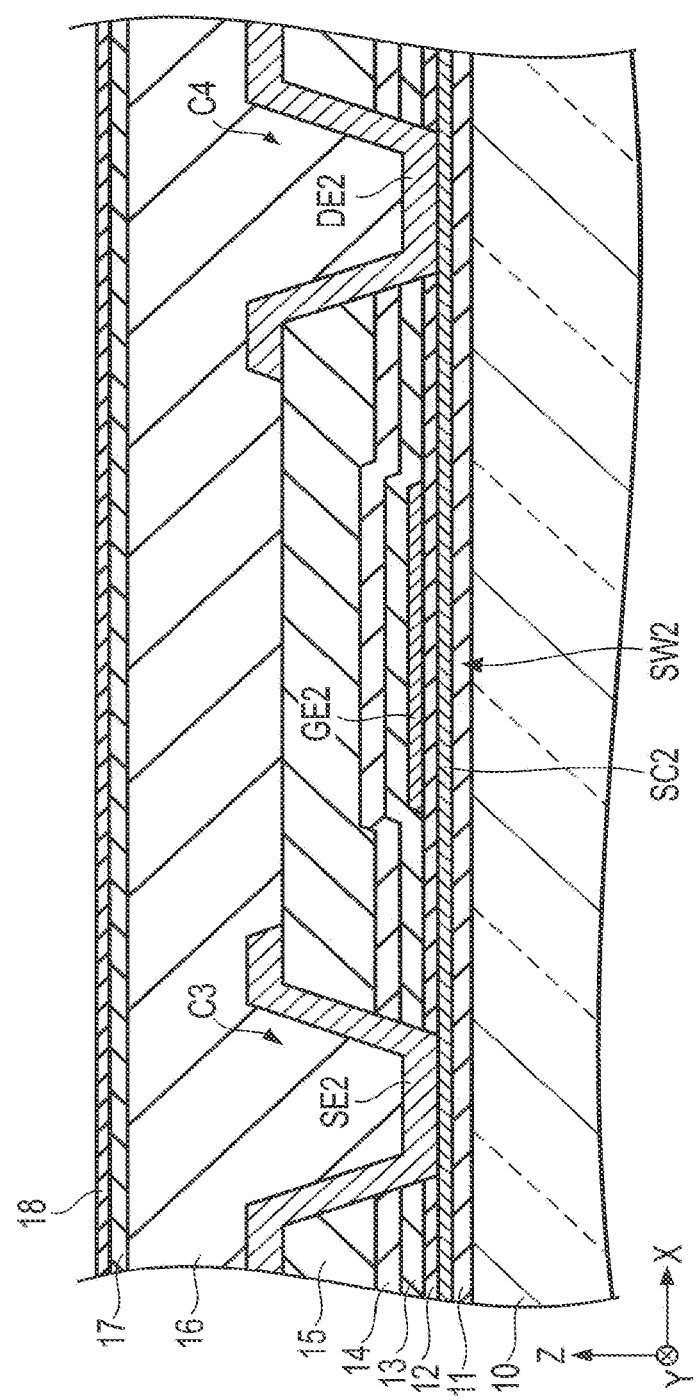
F I G. 4

DISPLAY DEVICE

CROSS-REFERENCE TO RELATED APPLICATIONS

This application is based upon and claims the benefit of priority from Japanese Patent Application No. 2016-125604, filed Jun. 24, 2016, the entire contents of which are incorporated herein by reference.

FIELD

Embodiments described herein relate generally to a display device.

BACKGROUND

In display devices using, for example, liquid crystal display elements or organic electroluminescent (EL) display elements, there has been a growing demand for smaller pixels. However, in such a smaller pixel, capacitance for maintaining a voltage applied to a pixel electrode becomes small. Therefore, a conductive line such as a signal line which supplies an image signal to the pixel is coupled with the pixel electrode, and an undesirable change is caused in the pixel potential by the coupling.

There is a case where such a change in pixel potential is visually recognized as flicker of a display image. In particular, such flicker tends to be visually recognized when a display device is driven at low frequency.

BRIEF DESCRIPTION OF THE DRAWINGS

FIG. 1 is a plan view schematically showing the structure of a display device of a first embodiment.

FIG. 2 is a schematic plan view of a sub-pixel of the display device of the first embodiment.

FIG. 4 is a schematic sectional view of a second switching element of the display device of the first embodiment.

DETAILED DESCRIPTION

Figure 3:
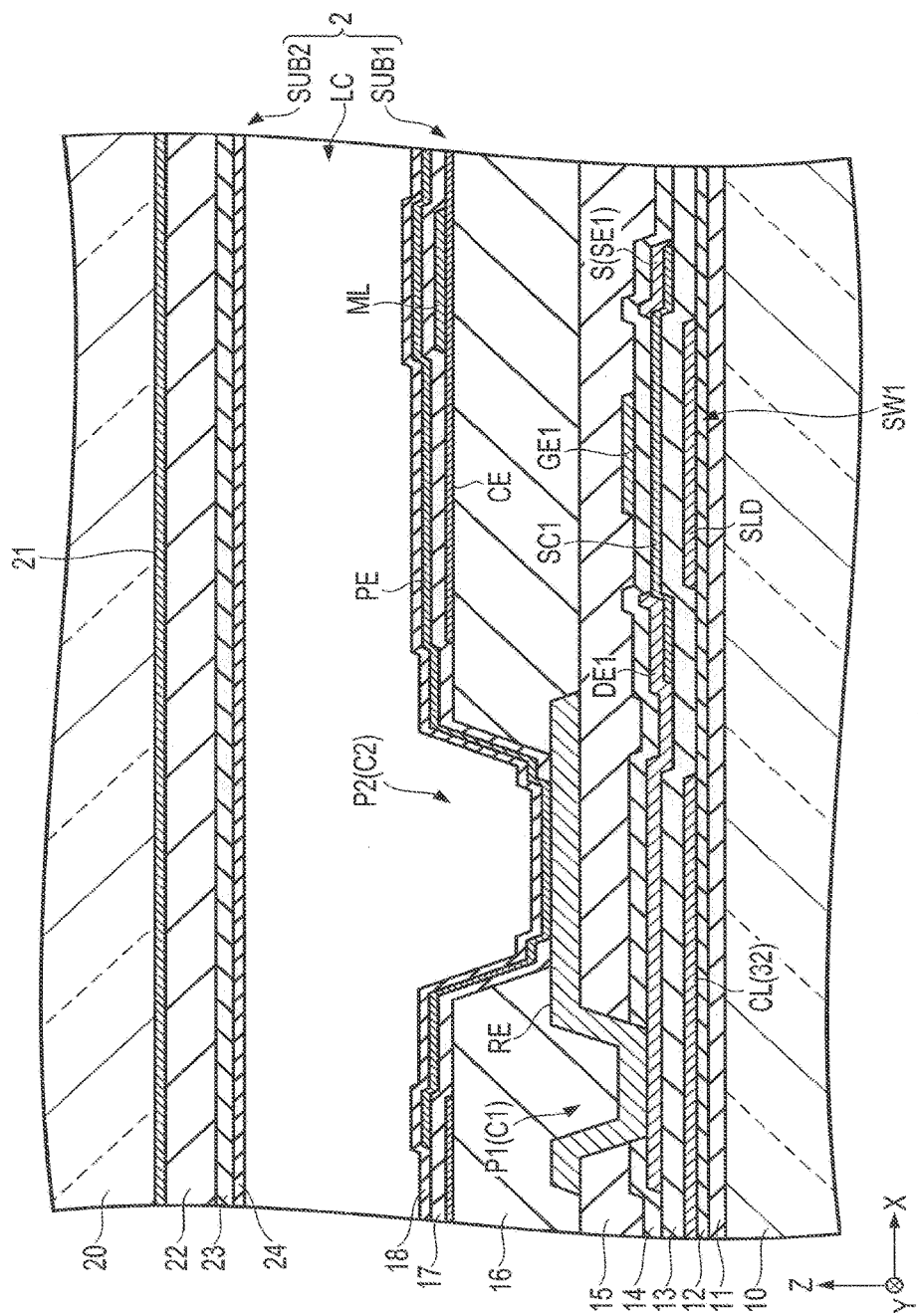
FIG. 3 is a schematic sectional view of the display device taken along line III-III of FIG. 2.

In general, according to one embodiment, a display device includes a pixel arranged in a display area, a scanning line extending in the display area, a signal line extending in the display area and crossing the scanning line, a pixel electrode arranged in the pixel, a first switching element arranged in the display area, and a capacitance line producing capacitance together with the pixel electrode. The first switching element includes a first semiconductor layer connected to the signal line and the pixel electrode, and a first gate electrode opposed to the first semiconductor layer and connected to the scanning line. The capacitance line includes a first portion opposed to the scanning line and extending in an extension direction of the scanning line, a second portion connected to the first portion and opposed to the pixel electrode.

Certain embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the respective parts are illustrated in the drawings schematically, rather than as an accurate representation of what is implemented. However, such schematic illustration is merely exemplary and in no way restricts the interpretation of the invention. In the drawings, reference numbers of continuously arranged elements equivalent or similar to each other are omitted in some cases. In addition, in the specification and drawings, structural elements equivalent or similar to those described in connection with preceding drawings are denoted by the same reference numbers, and detailed description thereof is omitted unless necessary.

In each embodiment, a liquid crystal display device will be described as an example of the display device. However, each embodiment does not preclude application of individual technical ideas disclosed in the embodiment to display devices other than the liquid crystal display device. Here, examples of the display devices other than the liquid crystal display device include a self-luminous display device comprising an organic electroluminescent display element, an electronic-paper type display device comprising an electrophoresis element, and the like.

(First Embodiment)

FIG. 1 is a plan view schematically showing the structure of a display device 1 of the first embodiment. The display device 1 includes a display panel 2 and a driver IC 3. The display panel 2 includes a first substrate SUB1 (array substrate), a second substrate SUB2 (counter-substrate), and a liquid crystal layer LC. In the example shown in FIG. 1, the size of the first substrate SUB1 is greater than the size of the second substrate SUB2. The first substrate SUB1 and the second substrate SUB2 are attached to each other such that three sides of one substrate are laid on three sides of the other substrate. The liquid crystal layer LC is sealed between the first substrate SUB1 and the second substrate SUB2.

In an area where the first substrate SUB1 and the second substrate SUB2 overlap each other, the display panel 2 includes a display area DA where pixels PX are formed for image display, and a surrounding area SA around the display area DA. Further, the display panel 2 includes a terminal area TA (unopposed area) where the first substrate SUB1 and the second substrate SUB2 do not overlap each other. In the example shown in FIG. 1, the driver IC 3 is mounted on the terminal area TA.

The first substrate SUB1 in the display area DA includes scanning lines G which extend in a first direction X and are arranged in a second direction Y, and signal lines S which extend in the second direction Y and are arranged in the first direction X. In the example shown in FIG. 1, the scanning line G and the signal line S are illustrated straight lines, but the scanning line G and the signal line S may also be bent or meandering. Hereinafter, the direction orthogonal to the first direction X and the second direction Y (the thickness direction of the display device 1) will be referred to as a third direction Z.

The first substrate SUB1 includes a first driver 4 (gate driver) connected to each of the scanning line G, and a second driver 5 (source driver) connected to each of the signal line S. In the example shown in FIG. 1, the first driver 4 is provided in the surrounding area SA and arranged along one side of the display area DA which extends in the second direction Y, and the second driver 5 is provided in the surrounding area SA and arranged between the display area DA and the terminal area TA. Note that the first driver 4 and the second driver 5 may be provided in the first substrate SUB1 in various other ways or may be provided on the outside of the first substrate SUB1. Alternatively, a pair of first drivers 4 may be provided along both sides of the display area DA which extend in the second direction Y.

The pixels PX are arranged in a matrix in the first direction X and the second direction Y. The pixel PX includes sub-pixels SP. For example, each sub-pixel SP corresponds to an area defined by two adjacent scanning lines G and two adjacent signal lines S. Note that, in the present disclosure, a sub-pixel may also be referred to simply as a pixel.

In the example shown in FIG. 1, three sub-pixels SP are included in one pixel PX. These three sub-pixels SP display, for example, red (R), green (G) and blue (B), respectively. Note that the pixel PX may include more than three sub-pixels SP. Further, the colors of the sub-pixels SP in the pixel PX are not limited to red, green and blue and may be other colors such as white and yellow.

In each of the sub-pixels SP, the first substrate SUB1 includes the first switching element SW1 and the pixel electrode PE. Further, a common electrode CE, which is provided as a common electrode for a plurality of sub-pixels SP, extends in each of the sub-pixels SP. The common electrode CE can be provided in either one of the first substrate SUB1 and the second substrate SUB2.

In FIG. 1, an auxiliary capacitance line CL extends in the display area DA. The auxiliary capacitance line CL extends in the extension direction of the scanning line G, that is, in the first direction X. A common voltage Vcom is supplied to the auxiliary capacitance line CL and the common electrode CE.

The driver IC 3 controls the first driver 4 and the second driver 5. The second driver 5 supplies an image signal to each of the signal lines S. The second driver 5 may perform column inversion drive which alternates the polarity of the image signals supplied to the adjacent signal lines S.

The first driver 4 includes vertical circuits 40. For example, each of the vertical circuits 40 includes a shift register and a buffer. The shift register of each vertical circuit 40 sequentially transfers a transfer pulse. The buffer of each vertical circuit 40 is connected to the corresponding scanning line G. When a transfer pulse is input to the shift register of the vertical circuit 40, the buffer of the vertical circuit 40 supplies a scanning signal to the connected scanning line G.

The vertical circuit 40 includes switching elements. These switching elements cooperate with each other to control the voltage of the scanning line G. At least some of the switching elements correspond to a second switching element SW2 which will be described with reference to FIG. 4. Other circuits such as the second driver 5 in the surround area SA may also include the second switching element SW.

When a scanning signal is supplied to the scanning line G corresponding to a certain first switch element SW1, an image signal to be supplied to the signal line S connected to the first switching element SW1 is supplied to the pixel electrode PE connected to the first switching element SW1. At this time, an electric field is produced between the pixel electrode PE and the common electrode CE, and the electric field acts on the liquid crystal layer LC. Through such processes, the turn-on and turn-off of each of the sub-pixels SP can be controlled.

Further, in the structure shown in FIG. 1, auxiliary capacitance CS is produced between the auxiliary capacitance line CL and the pixel electrode PE. As the auxiliary capacitance CS is produced, the voltage of the image signal is stably maintained, and consequently the display quality is improved.

The display device 1 may be a transmissive display device which displays an image by using light from a backlight or may also be a reflective display device which displays an image by reflecting external light or light from a front light. Further, the display device 1 may have both the function of a transmissive display device and the function of a reflective display device.

FIG. 2 is a schematic plan view of three sub-pixels SP included in one pixel PX. The first switching element SW1 includes a first semiconductor layer SC1 formed of, for example, an oxide semiconductor, a first source electrode SE1, a first gate electrode GE1, and a first drain electrode DE1. In the example shown in FIG. 2, the first semiconductor layer SC1 is arranged between the signal line S and the pixel electrode PE. Note that the first semiconductor layer SC1 is not necessarily formed into the shape shown in FIG. 2, and for example, the first semiconductor layer SC1 may be bent instead. Further, the first semiconductor layer SC1 may cross the scanning line G.

In planar view, the first gate electrode GE1 overlaps the first semiconductor layer SC1. The first gate electrode GE1 is electrically connected to the scanning line G. In the example shown in FIG. 2, the first gate electrode GE1 is integrally formed with the scanning line G and extends in the second direction Y. As another example, in a case where the first semiconductor layer SC1 crosses the scanning line G as described above, an area of the scanning line G which crosses the semiconductor layer SC1 corresponds to the first gate electrode GE1.

The first source electrode SE1 is electrically connected to the signal line S. In the example shown in FIG. 2, the first source electrode SE1 corresponds to a portion of the signal line S which overlaps the semiconductor layer SC1 in planar view. The first drain electrode DE1 is electrically connected to the first semiconductor layer SC1. Further, the first drain electrode DE1 is electrically connected also to the pixel electrode PE. In the example shown in FIG. 2, a relay electrode RE is interposed between the pixel electrode PE and the first drain electrode DE1. The relay electrode RE is in contact with the first drain electrode DE1 in a position P1 and is in contact with the pixel electrode PE in a position P2. As another example, the first drain electrode DE1 and the pixel electrode PE may be connected to each other without any intervening relay electrode RE.

In each of the sub-pixels SP, a shield SLD is arranged below the first semiconductor layer SC1. In planar view, the shield SLD overlaps an area where the first semiconductor layer SC1 and the first gate electrode GE1 are opposed to each other. When the area is irradiated with light from a backlight, leakage current may occur in the first switching element SW1. The shield SLD blocks the light from the backlight and prevents the above-described leakage current.

In the example shown in FIG. 2, the pixel electrode PE has one slit SL which extends parallel to the signal line S. Note that the pixel electrode PE may have more than one slits SL or may not have any slit SL at all.

The auxiliary capacitance line CL includes a first portion 31 which is opposed to the scanning line G, and second portions 32 which are connected to the first portion 31. The first portion 31 overlaps the scanning line G in planar view and extends in the first direction X. In the example shown in FIG. 2, the first portion 31 is slightly misaligned with the scanning line G, but the first portion 31 may be perfectly aligned with the scanning line G. In planar view, the second portion 32 overlaps a part of the pixel electrode PE, a part of the first drain electrode DE1, and the relay electrode RE. The above-described auxiliary capacitance CS is produced between the second portion 32, and the pixel electrode PE, the first drain electrode DE, and the relay electrode RE.

The scanning line G, the signal line S, the first gate electrode GE1, the first drain electrode DE1, the relay electrode RE, the shield SLD, and the auxiliary capacitance line CL are formed of a metal material. The pixel electrode PE is formed of, for example, indium tin oxide (ITO). Although not shown in FIG. 2, the above-described common electrode CE is opposed to the pixel electrode PE. The common electrode CE may be formed also of ITO.

An area indicated by a dashed line in the drawing corresponds to a light-shielding layer 21 which blocks light. The light shielding layer 21 is opposed to the signal line S, the scanning line G, the first switching element SW1, the shield SLD, and the relay electrode RE. The light-shielding layer 21 includes an aperture AP in the sub-pixel SP. The pixel electrode PE extends in the aperture AP.

FIG. 3 is a schematic sectional view of the display device 1 taken along line III-III of FIG. 2. The first substrate SUB1 includes a first insulating substrate 10, a first insulating layer 11, a second insulating layer 12, a third insulating layer 13, a fourth insulating layer 14, a fifth insulating layer 15, a sixth insulating layer 16, a seventh insulating layer 17, a first alignment film 18, the above-described signal line S, the above-described first switching element SW1, the above-described relay electrode RE, the above-described pixel electrode PE, and the above-described common electrode CE.

The first insulating substrate 10 is, for example, a transparent, glass substrate or resin substrate. The first insulating layer 11 covers the inner surface (the surface opposed to the second substrate SUB2) of the first insulating substrate 10. The second insulating layer 12 covers the first insulating layer 11. The auxiliary capacitance line CL (only the second portion 32 is shown in FIG. 3) and the shield SLD are formed on the second insulating layer 12.

The third insulating layer 13 covers the auxiliary capacitance line CL, the shield SLD, and the second insulating layer 12. The first semiconductor layer SC1 is formed on the third insulating layer 13. The signal line S and the first drain electrode DE1 are formed also on the third insulating layer 13. A part of the signal line S corresponding to the first source electrode SE1, and the first drain electrode DE1 cover a part of the first semiconductor layer SC1.

The fourth insulating layer 14 covers the first semiconductor layer SC1, the signal line S, and the first drain electrode DE1. The first gate electrode GE1 is formed on the fourth insulating layer 14. Although not shown in FIG. 3, the scanning line G is formed also on the fourth insulating layer 14. The fifth insulating layer 15 covers the scanning line G, the first gate electrode GE1, and the fourth insulating layer 14.

The relay electrode RE is formed on the fifth insulating layer 15. The relay electrode RE is in contact with the first drain DE1 in the above-described position P1 via a first contact hole C1 provided in the fourth insulating layer 14 and the fifth insulating layer 15.

The sixth insulating layer 16 covers the relay electrode RE and the fifth insulating layer 15. The sixth insulating layer 16 is formed of, for example, an organic resin material and is the thickest layer among the insulating layers 11 to 17. As the sixth insulating layer 16 is provided, unevenness resulting from the first switching element SW1 will be smoothed. The common electrode CE is formed on the sixth insulating layer 16. The seventh insulating layer 17 covers the common electrode CE and the sixth insulating layer 16. In the example shown in FIG. 3, a metal line ML opposed to the signal line S is formed on the common electrode CE. The metal line ML is opposed to the signal line S and extends along the signal line S.

The pixel electrode PE is formed on the seventh insulating layer 17. The first alignment film 18 covers the pixel electrode PE and the seventh insulating layer 17. The pixel electrode PE is in contact with the relay electrode RE in the above-described position P2 via a second contact hole C2 provided in the sixth insulating layer 16 and the seventh insulating layer 17.

The second substrate SUB2 includes a second insulating substrate 20, a color filter layer 22, an overcoat layer 23, a second alignment film 24, and the above-described light-shielding layer 21. The second insulating substrate 20 is, for example, a transparent, glass substrate or resin substrate. The light-shielding layer 21 is formed on the inner surface (the surface opposed to the first substrate SUB1) of the second insulating substrate 20. The color filter layer 22 covers the light-shielding layer 21 and the inner surface of the second insulating substrate 20. The color filter layer 22 is colored according to the color of each of the sub-pixels SP. The overcoat layer 23 covers the color filter layer 22. The second alignment film 24 covers the overcoat layer 23. The liquid crystal layer LC is arranged between the first alignment film 18 and the second alignment film 24.

The structure shown in FIG. 3 is applicable to in-plane switching (IPS) modes where the pixel electrode PE and the common electrode CE are provided in the first substrate SUB1, in particular, a fringe field switching (FFS) mode. However, the structure of the display device 1 is not limited to this structure. For example, the common electrode CE may be provided in the second substrate SUB2. Alternately, the common electrode CE may be provided in the first substrate SUB1 such that the common electrode CE may be closer to the liquid crystal layer LC than the pixel electrode PE.

FIG. 4 is a schematic sectional view of the second switching element SW2. The second switching element SW2 includes a second semiconductor layer SC2 formed of, for example, polycrystalline silicon, a second gate electrode GE2, a second source electrode SE2, and a second drain electrode DE2.

The second semiconductor layer SC2 is formed on the first insulating layer 11 and is covered with the second insulating film 12. The second gate electrode GE2 is formed on the second insulating film 12 and is covered with the third insulating layer 13. The second gate electrode GE2 is opposed to the second semiconductor layer SC2 via the second insulating layer 12.

The second source electrode SE2 and the second drain electrode DE2 are formed on the fifth insulating layer 15. In the second insulating layer 12, the third insulating layer 13, the fourth insulating layer 14, and the fifth insulating layer 15, a third contact hole C3 and a fourth contact hole C4 are provided. The second source electrode SE2 is in contact with the semiconductor layer SC2 via the third contact hole C3. The second drain electrode DE2 is in contact with the second semiconductor layer SC2 via the fourth contact hole C4.

In the structure shown in FIGS. 2 to 4, the scanning line G and the first gate electrode GE1 are formed in the first layer. The first layer in the present embodiment corresponds to the layer above the fourth insulating layer 14 (in other words, below the fifth insulating layer 15). It is possible to form the scanning line G and the first gate electrode GE1 in the same manufacturing process, for example, by forming a metal layer on the fourth insulating layer 14 as a base film and then patterning the metal layer.

Further, the auxiliary capacitance line CL, the shield SLD, and the second gate electrode GE2 are formed in the second layer. The second layer in the present embodiment corresponds to the layer above the second insulating layer 12 (in other words, below the third insulating layer 13). It is possible to form the auxiliary capacitance line CL, the shield SLD, and the second gate electrode GE2 in the same manufacturing process, for example, by forming a metal layer on the second insulating layer 12 as a base film and then patterning the metal layer.

Still further, the relay electrode RE, the second source electrode SE2, and the second drain electrode DE2 are formed in the third layer. The third layer in the present embodiment corresponds to the layer above the fifth insulating layer 15 (in other words, below the sixth insulating layer 16). It is possible to form the relay electrode RE, the second source electrode SE2, and the second drain electrode DE2 in the same manufacturing process, for example, by forming a metal layer on the fifth insulating layer and the contact holes C1, C3 and C4 as a base film and then patterning the metal layer.

Still further, the signal line S (the first source electrode SE1) and the first drain electrode DE1 are formed in the fourth layer. The fourth layer in the present embodiment corresponds to the layer above the third insulating layer 13 or the first semiconductor layer SC1 (in other words, below the fourth insulating layer 14). It is possible to form the signal line S and the first drain electrode DE1 in the same manufacturing process, for example, by forming a metal layer on the third insulating layer 13 and the first semiconductor layer SC1 as a base film and then patterning the metal layer.

As is evident from the above description, in the present embodiment, the first layer and the fourth layer are located between the second layer and the third layer, and the first layer is located between the third layer and the fourth layer.

The signal line S, the first drain electrode DE1, the relay electrode RE, the second source electrode SE2, and the second drain electrode DE2 have a stacked multilayer structure where, for example, aluminum or aluminum alloy is sandwiched between titanium or titanium alloy. Note that these elements may also have a single metal layer structure. In the example shown in FIGS. 3 and 4, the thicknesses of the relay electrode RE, the second source electrode SE2, and the second drain electrode DE2 are greater than the thicknesses of the signal line S and the first drain electrode DE1.

The scanning line G, the auxiliary capacitance line CL, the shield SLD, the first gate electrode GE1, and the second gate electrode GE2 are formed of, for example, a metal material such as molybdenum tungsten alloy (MoW). As an example, these elements have a single layer structure, but these elements may also have a stacked multilayer structure.

In the structure shown in FIGS. 2 and 3, the second portion 32 of the auxiliary capacitance line CL is opposed to the pixel electrode PE, the first drain electrode DE1, and the relay electrode RE. That is, the above-described auxiliary capacitance CS is formed between the auxiliary capacitance line CL, and the pixel electrode PE, the first drain electrode DE, and the relay electrode RE. As the auxiliary capacitance CS is produced, the voltage of the image signal supplied via the first switching element SW1 is stably maintained, and the change in the pixel potential caused by the coupling between the signal line S and the pixel electrode PE is suppressed. Consequently, the display quality of the display device 1 is improved.

Recently, to reduce the power consumption, there is case where the drive frequency of the display device 1 is reduced to such a level as 30 Hz or 15 Hz. The above-described flicker associated with the change in the pixel electrode is, although not easily visible to the viewer in the high-frequency drive, more likely to be visible to the viewer in the low-frequency drive. As the change in the pixel potential is suppressed in such a manner as that of the present embodiment, even in the low-frequency drive, the flicker will be less likely to be visible to the viewer.

Since the first portion 31 of the auxiliary capacitance line CL overlaps the scanning line G in planar view, as compared to a case where the auxiliary capacitance line CL does not overlap the scanning line G, the pixel layout can be made more efficient. In this way, the pixels PX can be reduced in size. Further, the area (aperture ratio) of the aperture AP in each sub-pixel SP can be increased.

The auxiliary capacitance line CL and the second gate electrode GE2 of the second switching element SW2 arranged in the surrounding area SA are formed in the same layer as each other. Therefore, the auxiliary capacitance line CL and the second switching element SW2 can be formed in the single manufacturing process, and consequently the manufacturing cost can be reduced.

Still further, the relay electrode RE, and the second source electrode SE2 and the second drain electrode DE2 of the second switching element SW2 are formed in the same layer as each other. Therefore, the relay electrode RE, the second source electrode SE2, and the second drain electrode DE2 can be formed in the single manufacturing process, and consequently the manufacturing cost can be reduced.

In addition to those described above, various other advantages can be achieved from the present embodiment.

(Second Embodiment)

The second embodiment will be described. Unless otherwise specified, the present embodiment has the same structures and advantages as those of the first embodiment.

Figure 5:
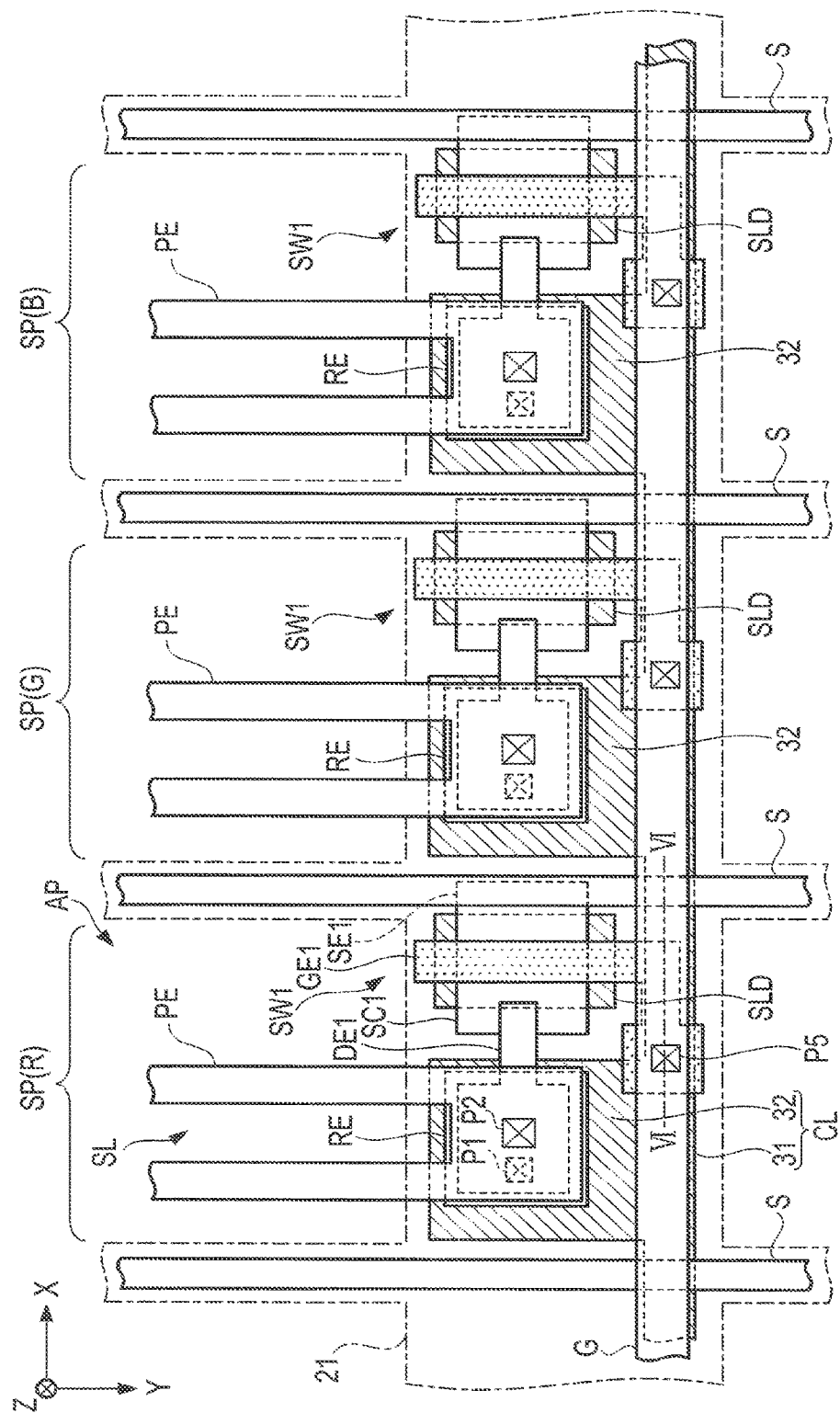
FIG. 5 is a schematic plan view of a sub-pixel of a display device of a second embodiment.

FIG. 5 is a schematic plan view of three sub-pixels SP included in one pixel PX in the display device 1 of the present embodiment. The structure shown in the drawing is different from the structure shown in FIG. 2 in the scanning line G and the first gate electrode GE1. That is, in the example shown in FIG. 5, the scanning line G and the first gate electrode GE1 are not integrally formed with each other. The scanning line G and the first gate electrode GE1 are connected to each other in a position P5. The first gate electrode GE1 extends from the position P5 in the first direction X in such a way as to overlap the scanning line G, and then bends and extends in the second direction Y.

Figure 6:
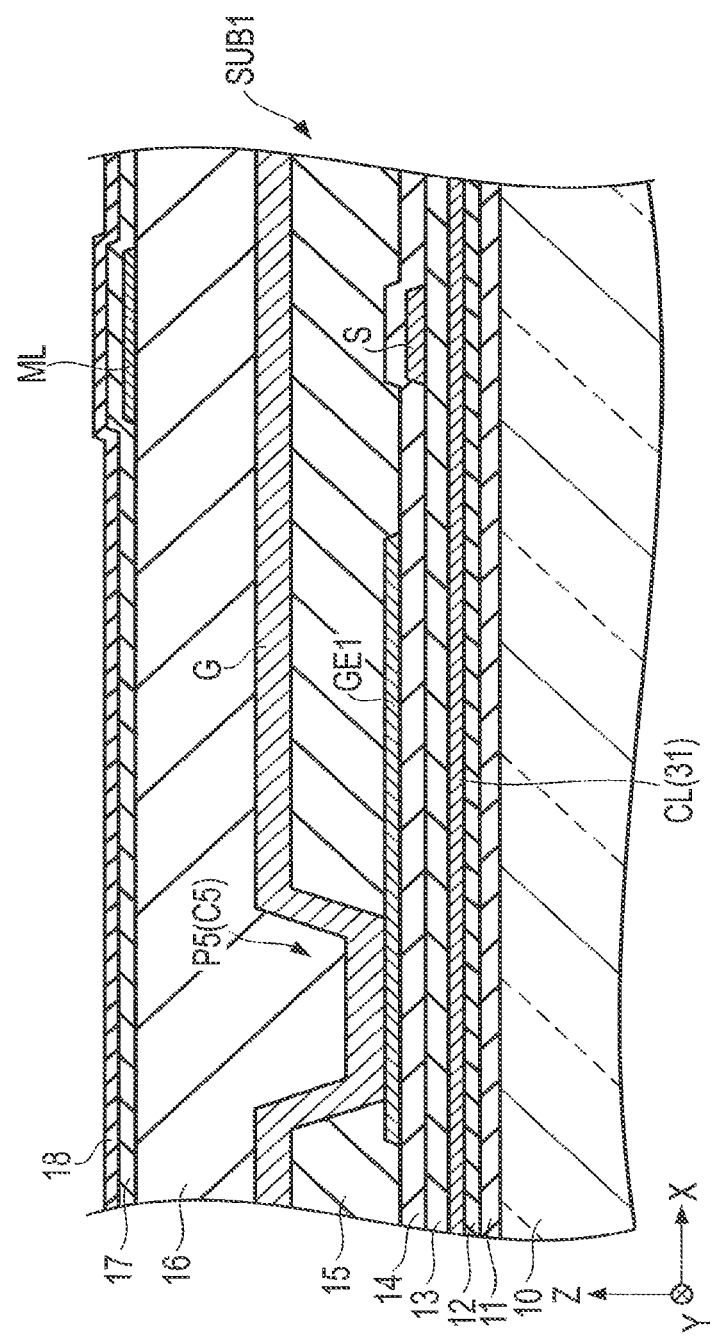
FIG. 6 is a schematic sectional view of a first substrate taken along line VI-VI of FIG. 5.

FIG. 6 is a schematic sectional view of the first substrate SUB1 taken along line VI-VI of FIG. 5. The first gate electrode GE1 is formed on the fourth insulating layer 14 and is covered with the fifth insulating layer 15. The scanning line G is formed on the fifth insulating layer 15 and is covered with the sixth insulating layer 16. The scanning line G is in contact with the first gate electrode GE1 in the position P5 via a fifth contact hole C5 provided in the fifth insulating layer 15.

In the structure shown in FIGS. 5 and 6, the scanning line G is formed in the first layer. The first layer in the present embodiment corresponds to the layer above the fifth insulating layer 15 (in other words, below the sixth insulating layer 16). The above-described relay electrode RE, the second source electrode SE2, and the second drain electrode DE2 are formed also in the first layer. It is possible to form the scanning line G, the relay electrode RE, the second source electrode SE2, and the second drain electrode DE2 in the same manufacturing process, for example, by forming a metal layer on the fifth insulating layer as a base film and then patterning the metal layer.

Further, the auxiliary capacitance line CL, the shield SLD, and the second gate electrode GE2 are formed in the second layer. As in the case with the first embodiment, the second layer in the present embodiment corresponds to the layer above the second insulating layer 12 (in other words, below the third insulating layer 13).

Further, the first gate electrode GE1 is formed in the third layer between the first layer and the second layer. The third layer in the present embodiment corresponds to the layer above the fourth insulating layer 14 (in other words, below the fifth insulating layer 15).

The scanning line G, the relay electrode RE, the second source electrode SE2, and the second drain electrode DE2 have a stacked multilayer structure where, for example, aluminum or aluminum alloy is sandwiched between titanium or titanium alloy. Note that these elements may also have a single metal layer structure. In the example shown in FIG. 6, the thickness of the scanning line G is greater than the thickness of any of the signal line S, the first gate electrode GE1, and the auxiliary capacitance line CL. The thickness of the relay electrode RE, the second source electrode SE2, and the second drain electrode DE2 is the same as the thickness of the scanning line G. Further, the resistance of the scanning line G is less than the resistance of the first gate electrode GE1.

As shown in FIGS. 2 and 5, in a structure where the scanning line G and the auxiliary capacitance line CL overlap each other, capacitance is produced between the scanning line G and the auxiliary capacitance line CL. Consequently, the time constant of the scanning line G will be increased. In this respect, in the structure of the present embodiment, a low-resistance conductive line which is provided in a layer higher than that of the first gate electrode GE1 is used as the scanning line G. Therefore, the time constant of the scanning line G can be reduced.

To reduce the resistance of the scanning line G, if the thicknesses of the scanning line G and the first gate electrode GE1 in the first embodiment are increased, the processing efficiency will be reduced, and if the width of the scanning line G is increased, the aperture ratio of each sub-pixel SP will be reduced. On the other hand, according to the structure of the present embodiment, it is possible to reduce the time constant while suppressing the impacts on the processing efficiency and the aperture ratio.

Further, the present embodiment can achieve the same technical advantages as those of the first embodiment.

Still further, all display devices implementable by a person having ordinary skill in the art through appropriate design change to the display devices described in the embodiments of the present invention will come within the scope of the present invention as long as they fall within the scope and spirit of the present invention.

Still further, it is natural for a person having ordinary skill in the art to conceive of various modifications of the present invention within the scope of the technical concept of the present invention, and such modifications will be encompassed by the scope and spirit of the present invention. For example, the above-described embodiments with appropriate addition, deletion and/or design change of the structural elements, or appropriate addition, omission and/or condition change of the manufacturing process by a person having ordinary skill in the art will also come within the scope of the present invention as long as they fall within the scope and spirit of the present invention.

Still further, concerning advantages other than those described in each of the embodiments, advantages obvious from the description of the present invention and advantages appropriately conceivable by a person having ordinary skill in the art will be regarded as the advantages achievable from the present invention as a matter of course.

What is claimed is:

1. A display device comprising:
a pixel arranged in a display area;
a scanning line extending in the display area;
a signal line extending in the display area and crossing the scanning line;
a pixel electrode arranged in the pixel;
a first switching element arranged in the display area, and including a first semiconductor layer connected to the signal line and the pixel electrode, and a first gate electrode opposed to the first semiconductor layer and connected to the scanning line; and
a capacitance line producing capacitance together with the pixel electrode, wherein
the capacitance line includes:
a first portion opposed to the scanning line and extending in an extension direction of the scanning line;
a second portion connected to the first portion and opposed to the pixel electrode; and
a relay electrode connecting the first semiconductor layer and the pixel electrode to each other, wherein
the scanning line and the first gate electrode are formed in a first layer,
the capacitance line is formed in a second layer,
the relay electrode is formed in a third layer, and
the first layer is located between the second layer and the third layer.

2. The display device of claim 1, wherein a thickness of the relay electrode is greater than a thickness of the signal line.

3. The display device of claim 1, wherein the second portion of the capacitance line is opposed to the relay electrode.

4. The display device of claim 1, further comprising a second switching element arranged in a surrounding area around the display area, wherein
the second switching element includes a second semiconductor layer, and a second gate electrode opposed to the second semiconductor layer, and
the second gate electrode is formed in the second layer.

5. The display device of claim 1, further comprising a shield overlapping an area where the first semiconductor layer and the first gate electrode are opposed to each other, wherein
the shield is formed in the second layer.

6. A display device comprising:
a pixel arranged in a display area;
a scanning line extending in the display area;
a signal line extending in the display area and crossing the scanning line;
a pixel electrode arranged in the pixel;
a first switching element arranged in the display area, and including a first semiconductor layer connected to the signal line and the pixel electrode, and a first gate electrode opposed to the first semiconductor layer and connected to the scanning line; and
a capacitance line producing capacitance together with the pixel electrode, wherein the capacitance line includes:
a first portion opposed to the scanning line and extending in an extension direction of the scanning line;
a second portion connected to the first portion and opposed to the pixel electrode; and
a relay electrode connecting the first semiconductor layer and the pixel electrode to each other, wherein
the scanning line is formed in a first layer,
the capacitance line is formed in a second layer,
the first gate electrode is formed in a third layer between the first layer and the second layer, and
the relay electrode is formed in the first layer.

7. The display device of Claim 6, wherein the second portion of the capacitance line is opposed to the relay electrode.

8. The display device of claim 6, further comprising a second switching element arranged in a surrounding area around the display area, wherein
the second switching element includes a second semiconductor layer, and a second gate electrode opposed to the second semiconductor layer, and
the second gate electrode is formed in the second layer.

9. The display device of claim 6, further comprising a shield overlapping an area where the first semiconductor layer and the first gate electrode are opposed to each other, wherein
the shield is formed in the second layer.

10. The display device of claim 6, wherein a thickness of the scanning line is greater than a thickness of the first gate electrode.

* * * * *